(12) United States Patent
Norling et al.

(10) Patent No.: US 9,455,697 B2
(45) Date of Patent: Sep. 27, 2016

(54) SWITCH CIRCUIT WITH A FIRST TRANSISTOR DEVICE AND A SECOND TRANSISTOR DEVICE CONNECTED IN SERIES

(71) Applicant: Infineon Technologies Austria AG, Villach (AT)

(72) Inventors: Karl Norling, Villach (AT); Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 108 days.

(21) Appl. No.: 13/631,459

(22) Filed: Sep. 28, 2012

(65) Prior Publication Data
US 2014/0091852 A1  Apr. 3, 2014

(51) Int. Cl.
H03K 3/00     (2006.01)
H03K 17/10    (2006.01)
H03K 17/687   (2006.01)

(52) U.S. Cl.
CPC ..... *H03K 17/102* (2013.01); *H03K 2017/6875* (2013.01)

(58) Field of Classification Search
USPC ......................................................... 327/108
See application file for complete search history.

(56) References Cited

U.S. PATENT DOCUMENTS

| | | | | |
|---|---|---|---|---|
| 4,365,316 A | * | 12/1982 | Iwahashi | G11C 5/066 326/106 |
| 4,945,266 A | * | 7/1990 | Mori | 327/428 |
| 5,396,085 A | | 3/1995 | Baliga | |
| 6,838,925 B1 | * | 1/2005 | Nielsen | H02M 7/487 327/391 |
| 6,972,611 B1 | * | 12/2005 | Thalheim | 327/434 |
| 7,852,137 B2 | * | 12/2010 | Machida et al. | 327/427 |
| 2004/0047098 A1 | | 3/2004 | Friedrichs et al. | |
| 2008/0191216 A1 | * | 8/2008 | Machida et al. | 257/76 |
| 2009/0002036 A1 | * | 1/2009 | Umeda | 327/108 |

FOREIGN PATENT DOCUMENTS

DE         10101744 C1   8/2002
DE   10 2006 029 928 B3   9/2007

* cited by examiner

*Primary Examiner* — Lincoln Donovan
*Assistant Examiner* — Patrick Chen
(74) *Attorney, Agent, or Firm* — Slater Matsil, LLP

(57) ABSTRACT

A method can be used for driving a switch circuit. The switch circuit includes a first transistor device and a second transistor device. Both the first transistor device and the second transistor device have a load path and a control terminal. The load paths of the first transistor device and the second transistor device are connected in series. The control terminal of the first transistor device is configured to receive a first drive signal and the control terminal of the second transistor device is configured to receive a second drive signal. One of an on-level switching on the first transistor device or an off-level switching off the first transistor device of the first drive signal is selected and one of a first signal level and a second signal level of the second drive signal is selected.

29 Claims, 3 Drawing Sheets

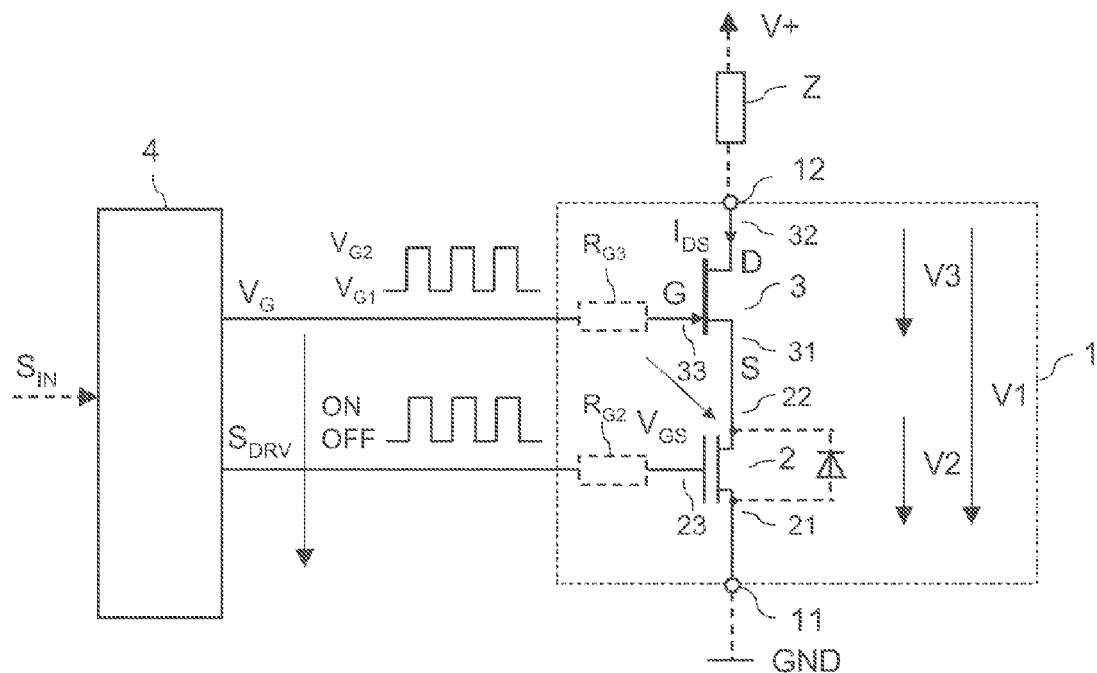
FIG 1
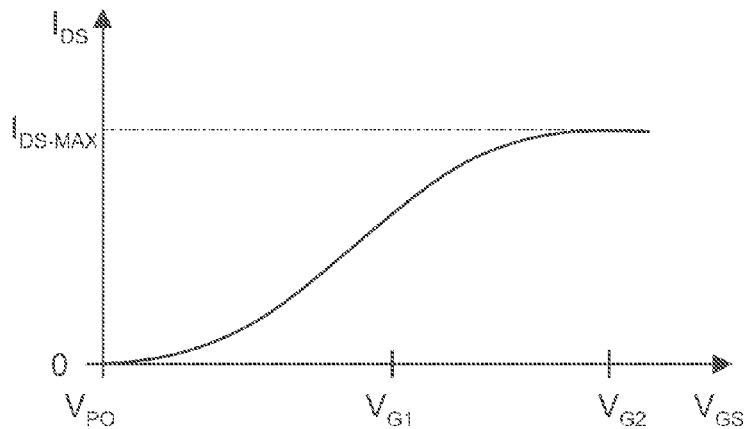
FIG 2
FIG 3

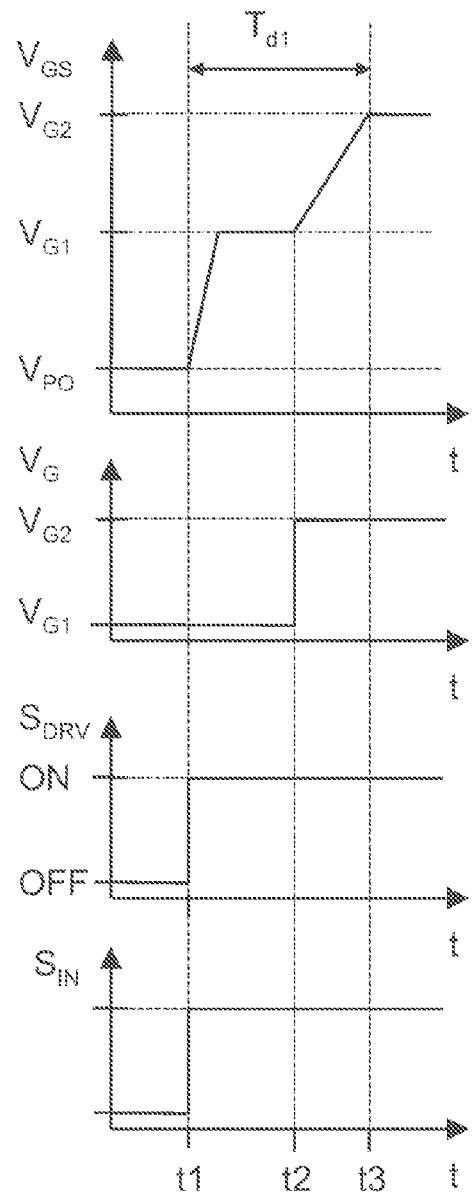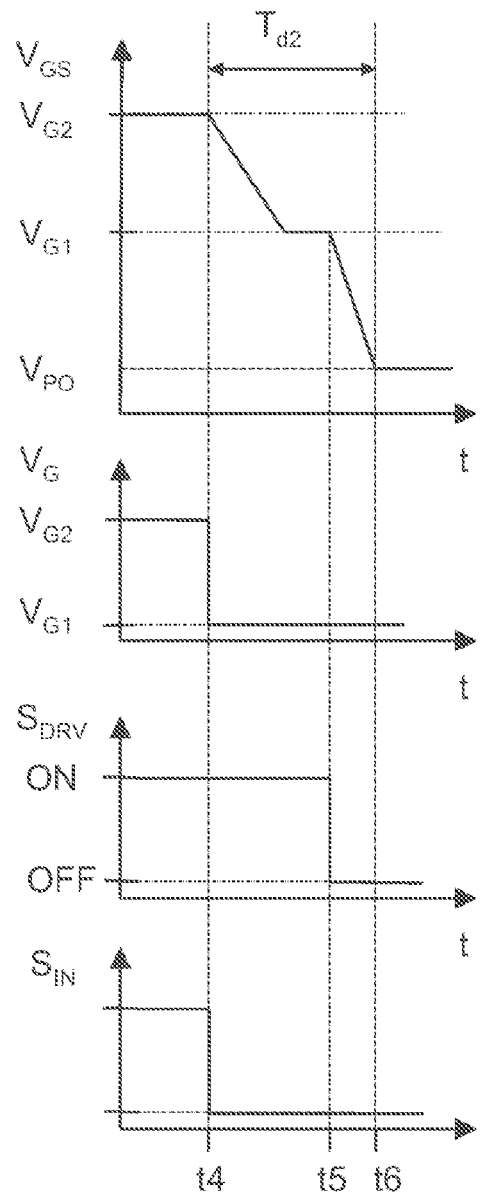
FIG 4A
FIG 4B

SWITCH CIRCUIT WITH A FIRST TRANSISTOR DEVICE AND A SECOND TRANSISTOR DEVICE CONNECTED IN SERIES

TECHNICAL FIELD

Embodiments of the present invention relate to a switch circuit with a first transistor device (e.g., a normally-off transistor device) and a second transistor device (e.g., a normally-on transistor device) connected in series and to a method for driving such electronic circuit.

BACKGROUND

Composite circuits including a normally-on transistor device and a normally-off transistor device connected in series are known. In this type of composite circuit, a normally-on transistor device with a high-voltage blocking capability and a low on-resistance may be combined with a low-voltage normally-off transistor in order to obtain a normally-off switching behavior of the composite circuit.

According to one conventional concept, the normally-off transistor has a control terminal (gate terminal) coupled to one of the load terminals of the normally-on transistor. This circuit can be switched on and off by switching on and off the normally-off transistor device, because the switching state of the normally-on transistor always follows the switching state of the normally-off transistor device.

According to a further conventional concept, the normally-off transistor is permanently switched on when the circuit is in a normal operation mode, and the normally-on transistor device is switched on and off by virtue of a drive signal applied to its control terminal.

SUMMARY OF THE INVENTION

A first embodiment relates to a method for driving a switch circuit. The switch circuit includes a first transistor device and a second transistor device, each of the first transistor device and the second transistor device includes a load path and a control terminal, the load paths of the first transistor device and the second transistor device are connected in series, the control terminal of the first transistor device is configured to receive a first drive signal, and the control terminal of the second transistor device is configured to receive a second drive signal. The method includes selecting one of an on-level switching on the first transistor device and an off-level switching off the first transistor device of the first drive signal, and selecting one of a first signal level and a second signal level of the second drive signal, wherein each of the first and second signal levels switches on the second transistor device when the first transistor device has been switched on.

A second embodiment relates to an electronic circuit including a switch circuit and a drive circuit coupled to the switch electronic. The switch circuit includes a first transistor device and a second transistor device, each of the first transistor device and the second transistor device having a load path and a control terminal, wherein the load paths of the first transistor device and the second transistor device are connected in series. The control terminal of the first transistor device is configured to receive a first drive signal, and the control terminal of the second transistor device is configured to receive a second drive signal. The drive circuit is configured to generate the first and second drive signals such that the first drive signal assumes one of an on-level switching on the first transistor device and an off-level switching off the first transistor device, and that the second drive signal assumes one of a first signal level and a second signal level of the second drive signal, wherein each of the first and second signal levels switches on the second transistor device when the first transistor device has been switched on.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 illustrates an embodiment of an electronic circuit including a switch circuit with a first transistor device and a second transistor device, and a drive circuit coupled to the switch circuit;

FIG. 2 illustrates conduction states of the second transistor device dependent on the internal drive signal;

FIG. 3 illustrates operation states (conduction states) of the second transistor device dependent on a switching state of the first transistor device and dependent on an external drive signal;

FIG. 4, which includes FIGS. 4A and 4B, illustrates the operating principle of the switch circuit according to first and second embodiments;

FIG. 5, which includes

DETAILED DESCRIPTION OF ILLUSTRATIVE EMBODIMENTS

Figure 5A:
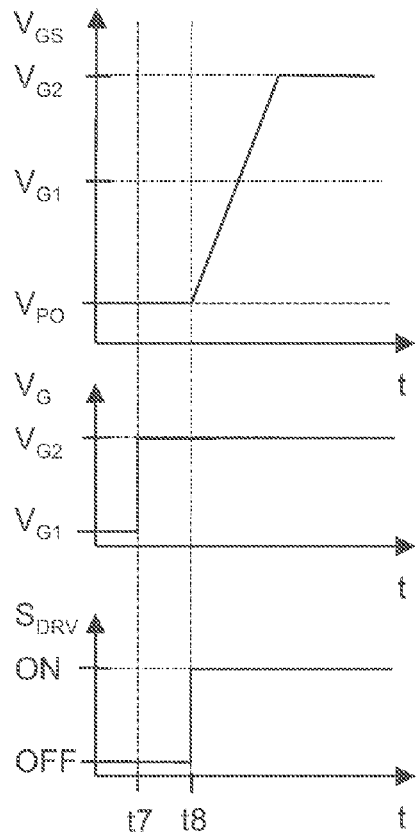
FIGS. 5A and 5B, illustrates the operating principle of the switch circuit according to third and fourth embodiments.

In the following Detailed Description, reference is made to the accompanying drawings, which form a part thereof, and in which are shown by way of illustration specific embodiments in which the invention may be practiced.

FIG. 1 illustrates one embodiment of an electronic circuit that includes a switch circuit 1 and a drive circuit 4 coupled to the switch circuit 1. The switch circuit 1 includes a first transistor device 2 and a second transistor device 3. The first transistor device 2 includes a load path between a first load terminal 21 and a second load terminal 22, and a control terminal 23, and the second transistor device 3 includes a load path between a first load terminal 31 and a second load terminal 32, and a control terminal 33. The load paths of the first and second transistor devices 2, 3 are connected in series by having the first load terminal 31 of the second transistor device 3 coupled to the second load terminal 22 of the first transistor device 2.

According to one embodiment, the first transistor device 2 is a normally-off transistor. This transistor is schematically illustrated as an MOS transistor in the embodiment of FIG. 1. However, this is only an example. The first transistor device 2 can be implemented as a conventional normally-off transistor. Conventional normally-off transistors are, e.g., n-type or p-type enhancement MOSFETs (Metal-Oxide-Semiconductor Field-Effect Transistors), n-type or p-type IGBTs (Insulated Gate Bipolar Transistors), or npn or pnp bipolar junction transistors (BJTs). In case the first transistor device 2 is implemented as a MOSFET or a IGBT, the control terminal 23 is a gate terminal of the transistor device, and the first and second load terminals 21, 22 are source and drain terminals, respectively, of the transistor device. In case the first transistor device 2 is implemented as a BJT, the control terminal 23 is a base terminal, while the first and second load terminals 21, 22 are emitter and collector terminals, respectively.

According to one embodiment, the second transistor device 3 is a normally-on transistor device, such as a junction FET (JFET), a depletion MOSFET, or a High-Electron-Mobility Transistor (HEMT). Just for illustration purposes, the second transistor device 3 of FIG. 1 is implemented as a JFET, in particular an n-type JFET. In this case, the control terminal 33 forms a gate terminal, the first load terminal 31 forms a source terminal, and the second load terminal 32 forms a drain terminal. In particular, the second transistor device 3 may be implemented as a silicon carbide (SiC), JFET, or as a gallium-nitride (GaN) High-Electron-Mobility-Transistor (HEMT).

The switch circuit 1 can be used as a switch for switching a current $I_{DS}$ through a load Z. Such an application of the switching circuit 1 as an electronic switch for switching a current $I_{DS}$ through a load is schematically illustrated in FIG. 1. In this case, the series circuit with the first and second transistor devices 2, 3 is connected in series with the load Z between terminals for first and second (positive and negative) supply potentials V+, GND. The switch circuit 1 can be driven in an on-state and an off-state. When the switch circuit 1 is in the on-state, a supply voltage available between the first and second supply terminals mainly drops across the load Z, causing a load current $I_{DS}$ other than zero through the load Z, while the supply voltage mainly drops across the switch circuit 1 when the switch circuit 1 is in the off-state.

There are normally-on transistor devices available that have lower on-resistances (at a given voltage blocking capability) than comparable normally-off transistor devices. In the switch circuit of FIG. 1 such a normally-on transistor device can be used as the second transistor 3, while the normally-off first transistor device 2 ensures that the switch circuit 1 operates like a normally-off electronic switch. This is be explained in further detail herein below.

Referring to FIG. 1, the control terminal 23 of the first transistor device 2 receives a first drive signal $S_{DRV}$, and the control terminal 33 of the second transistor device 3 receives a second drive signal $V_G$. These first and second drive signals $S_{DRV}$, $V_G$ are provided by the drive circuit 4. The first drive signal $S_{DRV}$ assumes one of an on-level that switches on the first transistor device 2, and an off-level that switches off the first transistor device 2. Just for explanation purposes it is assumed that the first transistor drive 2 is an n-type enhancement MOSFET with a gate terminal as the control terminal 23, a source terminal as the first load terminal 21, and a drain terminal as a second load terminal 22. In this case, the first drive signal $S_{DRV}$ is the gate-source voltage (the voltage between the control terminal 23 and the first load terminal 21), wherein the on-level corresponds to a gate-source voltage above a threshold voltage of the MOSFET, while the off-level corresponds to a gate-source voltage below the threshold voltage, such as zero.

Referring to FIG. 1, the second drive signal $V_G$ applied to the control terminal 33 (gate terminal) of the second transistor device 3 is a voltage between the control terminal 33 and the first load terminal 21 of the first transistor device 2. That is, the second drive signal $V_G$ is applied to the second transistor device 3 through the first transistor device 2. In the following, the second drive signal $V_G$ will also be referred to as external drive signal of the second transistor device 3.

The switching state (conduction state) of the second transistor device 3 is defined by an internal drive signal $V_{GS}$ between the control terminal 33 and the first load terminal 31. If the second transistor device 3 is implemented as a JFET, the internal drive signal $V_{GS}$ is the gate-source voltage of the JFET.

Referring to FIG. 1, the internal drive signal $V_{GS}$ is dependent on the external drive signal $V_{GS}$ as follows:

$$V_{GS} = V_G - V2 \qquad (1),$$

where V2 is the load path voltage (the voltage between the second and first load terminals 22, 21) of the first transistor device 2.

The drive circuit 4 generates the external drive signal $V_G$ with one of a first signal level $V_{G1}$, and a second signal level $V_{G2}$. These first and second signal levels are such that each of the first and second signal levels $V_{G1}$, $V_{G2}$ switches on the second transistor device 3 when the first transistor device 2 has been switched on. However, the first and second signal levels $V_{G1}$, $V_{G2}$ are different in such a way that the first and second signal levels $V_{G1}$, $V_{G2}$ drive the second transistor device 3 in two different conduction states. This is explained with reference to FIG. 2 below.

FIG. 2 schematically illustrates a load current $I_{DS}$ through the second transistor device 3 dependent on the internal drive voltage $V_{GS}$. Referring to FIG. 2, the current $I_{DS}$ is zero at internal drive voltages $V_{GS}$ below a threshold voltage (pinch-off voltage) $V_{PO}$. That is, the second transistor device 3 is switched off at internal drive voltages $V_{GS}$ below the pinch-off voltage. The specific value of the pinch-off voltage is dependent on the specific type of second transistor device 3. According to one embodiment, the pinch-off voltage is, e.g., a voltage between −25V and −15V. The first and second signal levels $V_{G1}$, $V_{G2}$ of the external drive signal $V_G$ are higher than the pinch-off voltage $V_{PO}$, so that the second transistor device 3 is conducting a current when the first transistor device 2 has been switched on and when one of the first and second signal levels $V_{G1}$, $V_{G2}$ is applied to the second transistor device 3.

For explanation purposes it is assumed that the load path voltage V2 of the first transistor device 2 is approximately zero when the first transistor device 2 has been switched on. In this case, the internal drive signal $V_{GS}$ corresponds to the external drive signal $V_G$ when the first transistor device 2 has been switched on. Referring to FIG. 2, the first and second signal levels $V_{G1}$, $V_{G2}$ of the external drive signal $V_G$ are such that the first and second signals levels $V_{G1}$, $V_{G2}$ operate the second transistor device 3 in different conduction states. The first signal level $V_{G1}$ is between the pinch-off voltage and the second signal level $V_{G2}$, so that the first signal level $V_{G1}$ causes a lower load current $I_{DS}$ through the second transistor device 3 than the second signal level $V_{G2}$. That is, the current capability of the second transistor device 3 is lower at the first signal level $V_{G1}$ than at the second signal level $V_{G2}$, and the on-resistance is higher at the first signal $V_{G1}$ level than at the second signal level $V_{G2}$.

Referring to FIG. 2, the load current $I_{DS}$ cannot be increased to above a maximum load current $I_{DS-MAX}$ (at a given load path voltage of the second transistor device 3). That is, the on-resistance of the second transistor device 3 cannot be increased to below a minimum on-resistance. The second transistor device 3 has been completely switched on when the on-resistance has reached its minimum. According to one embodiment, the second signal level $V_{G2}$ is such that it completely switches on the second transistor device 3 (so that the on-resistance has a minimum). According to one embodiment, the second signal level $V_{G2}$ is zero or even positive.

Dependent on the signal level of the first drive signal $S_{DRV}$ and the signal level of the external drive signal $V_G$ the switch circuit 1 can assume one of three different operation states that are explained with reference to FIG. 3 below. The operation state of the switch circuit 1 is dependent on the operation states of the first transistor device 2 and the second transistor device 3. FIG. 3 illustrates the operation state of the switch circuit 1, in particular of the second transistor device 3 of the switch circuit 1, dependent on the signal levels of the first drive signal $S_{DRV}$ and the second drive signal (external drive signal) $V_G$.

When the first drive signal $S_{DRV}$ has an on-level ON, the second transistor device 3 assumes one of a first and a second operation state dependent on the external drive signal $V_G$ (which essentially corresponds to the internal drive signal $V_{GS}$). In each of the first and second operation states the second transistor device 3 is switched on. However, the current capability and the on-resistance of the second transistor device 3 is different in the first and second operation states.

When the first drive signal $S_{DRV}$ has an off-level OFF, the first transistor device 2 is switched off. In this case, the second transistor device 3 is switched off (is in a third operation state) independent of the signal level of the external drive signal $V_G$. This is be explained with reference to FIG. 1 in the following. When there is a positive supply voltage across the series circuit with the first and second transistor devices 2, 3, and when the first transistor device 2 is switched off, the load path voltage V2 across the first transistor device 2 increases. Referring to equation (1), an increase of the load path voltage V2 results in a decrease of the internal drive signal $V_{GS}$. The load path voltage V2 of the first transistor device 2 increases until the external drive signal $V_{GS}$ (the internal drive voltage) reaches the pinch-off voltage $V_{PO}$, so that:

$$V_{GS} = V_{PO} = V_G - V2 \qquad (2).$$

The load path voltage V2 of the first transistor device is, therefore:

$$V2 = V_G - V_{PO} \qquad (3).$$

Thus, independent of the external drive signal $V_G$, the second transistor device 3 is in the off-state, when the first transistor device 2 is in the off-state. That is, in the off-state of the switch circuit 1, both of the first and second transistor devices 2, 3 are in the off-state, independent of the signal level of the external drive signal $V_G$. Only the load path voltage V2 of the first transistor device 2 is dependent on the signal level of the external drive signal $V_G$, as defined by equation (3). According to one embodiment, the voltage blocking capability of the first transistor device 2 at least corresponds to the magnitude of the pinch off voltage $V_{PO}$ of the second transistor device 3.

The magnitude of the pinch off voltage $V_{PO}$ is, for example, in the range of several volts, up to several 10 volts, while the voltage blocking capability of the second transistor device 3 may be in the range of up to several 100 volts or even several kilovolts. When the switch circuit 1 switches from the on-state to the off-state, or switches from the off-state to the on-state, it may be desirable to control the slope of the load path voltage V1 of the switch circuit 1, wherein the load path voltage V1 corresponds to the sum of the load path voltage V3 of the second transistor device 3 and the load path voltage V2 of the first transistor device 2.

When the voltage applied to the switch circuit 1 in the off-state is significantly higher than the pinch off voltage $V_{PO}$ of the second transistor device 3, the load path voltage V1 of the switch circuit 1 approximately corresponds to the load path voltage V3 of the second transistor device 3. Thus, it may be desirable to control the slope of the load path voltage V3 of the second transistor device 3 in transitions of the switch circuit 1 from the on-state to the off-state, and vice versa.

Embodiments of controlling the slope of the load path voltage V3 of the second transistor device 3 are explained with reference to FIGS. 4A and 4B below. FIG. 4A illustrates a method for controlling the slope of the load path voltage V3 in a transition from the off-state to the on-state of the switch circuit 1, and FIG. 4B illustrates a method for controlling the slope of the load path voltage V3 in a transition from the on-state to the off-state of the switch circuit 1. FIGS. 4A and 4B each show timing diagrams of the internal control signal $V_{GS}$, the external control signal $V_G$ and the first drive signal $S_{DRV}$.

Referring to FIG. 4A the first drive signal $S_{DRV}$ has an off-level before time t1, so that the first transistor device 2 and, therefore, the switch circuit 1 is in the off-state before the first time t1. At time t1, the signal level of the first drive signal $S_{DRV}$ changes from the off-level to the on-level, so as to switch on the first transistor device 2. When the first transistor device 2 is switched on, the internal drive signal $V_{GS}$ of the second transistor device 3 increases from the pinch off voltage $V_{PO}$ to the first signal level $V_{G1}$. A rate at which the internal drive signal $V_{GS}$ increases is dependent on the switching speed of the first transistor device 2. That is, the rate of the increase of the internal drive signal $V_{GS}$ is dependent on the rate at which the first transistor device 2 switches from the off-state to the on-state. Referring to FIG. 1, the switching speed of the first transistor device 2 is, inter alia, dependent on a gate resistance $R_{G2}$ of the first transistor device 2. The switching speed increases as the gate resistance $R_{G2}$ decreases.

The second transistor device 3 is in the first operation state (first conduction state) when the internal drive signal $V_{GS}$ reaches the first signal level $V_{G1}$. Referring to FIG. 4A, the drive signal $V_G$ changes from the first signal level $V_{G1}$ to the second signal $V_{G2}$ at a second time t2 which is after the first time t1. After the second time t2 the internal drive signal $V_{GS}$ increases from the first signal level $V_{G1}$ to the second signal level $V_{G2}$. A rate at which the internal drive signal $V_{GS}$ increases is, inter alia, dependent on a gate resistance $R_{G3}$ (see FIG. 1) of the second transistor device 3. The gate resistances $R_{G2}$, $R_{G3}$ can be internal and/or external resistances between the internal gate electrode (not illustrated) of the respective transistor device 2, 3 and the drive circuit 4.

Referring to FIG. 4A, t3 denotes a time at which the internal drive signal $V_{GS}$ reaches the second signal level $V_{G2}$. For explanation purposes it may be assumed that the second transistor device 3 has been completely switched on at the time t3. Referring to FIG. 4A, there is a time delay $T_{d1}$ between the first time t1 when the first transistor device 2 starts to be switched on and the third time t3 at which the second transistor device 3 has been completely switched on. Within this time delay $T_{d1}$ the path voltage V2, which has a maximum when the switch circuit 1 is switched off, decreases until it reaches a minimum at time t3. In the method of FIG. 4A, this time delay $T_{d1}$, and, therefore, the slope of the output voltage V3 can be adjusted through different parameters, namely a time difference t2−t1 between the first and second times, t1, t2 and the value of the first signal level $V_{g1}$ relative to the second signal $V_{G2}$ and the pinch off voltage $V_{PO}$.

When the switch circuit 1 is switched from the on-state to the off-state, the external drive signal $V_G$ changes from the second signal level $V_{G2}$ to the first signal level $V_{G1}$ before the first transistor device 2 is switched off. In the embodiment of FIG. 4B, t4 is the time at which the signal level of the external drive signal $V_G$ changes so that the internal drive signal $V_{GS}$ starts to decrease. A rate at which the internal drive signal $V_{GS}$ decreases is, inter alia, dependent on the gate resistance $R_{G3}$ (see FIG. 1) of the second transistor device 3.

Referring to FIG. 4B, the first transistor device 2 is switched off at time t5. Time t5 is after time t4 and, in the present embodiment, after the internal drive signal $V_{GS}$ has decreased to the first signal level $V_{G1}$. The internal drive signal $V_{GS}$ further decreases when the first transistor device 2 is switched off. The rate, at which the internal drive signal $V_{GS}$ decreases after the first transistor device 2 has been switched off is, inter alia, dependent on the gate resistance $R_{G2}$ of the first transistor device 2. Referring to FIG. 4B, the internal drive signal $V_{GS}$ reaches the pinch-off voltage at time t6 at which the both the first and second transistor devices 2, 3 are switched off, so that the switch circuit 1 assumes the off-state.

A time delay $T_{d2}$ between time t4 at which the external drive signal $V_G$ changes from the second signal level $V_{G2}$ to the first signal level $V_{G1}$ and time t6 at which the switch circuit 1 switches off is dependent on a time difference t5−t4 and the first signal level $V_{G1}$ relative to the second signal level $V_{G2}$ and the pinch off voltage $V_{PO}$. Thus, like in the transition from the off-state to the on-state illustrated in FIG. 4A the slope of the load path voltage V3 can be adjusted through the time delay t5−t4 and the first signal level $V_{G1}$.

Figure 5B:
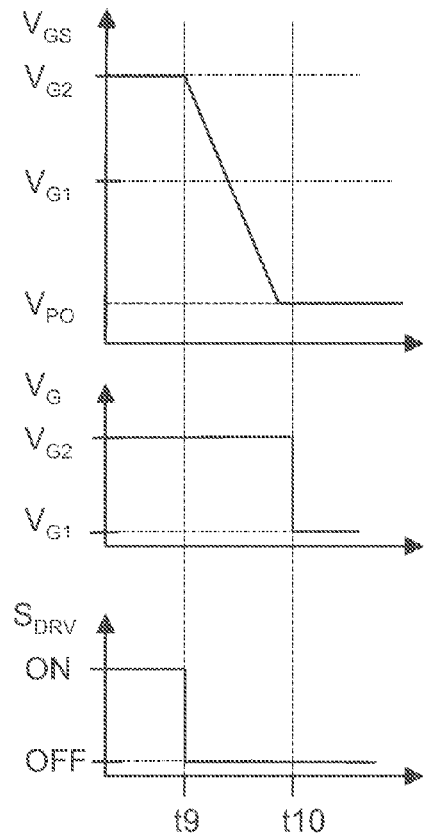

Referring to FIGS. 5A and 5B, these time delays may be minimized and, therefore, slopes of the load path voltage V3 may be maximized when the signal level of the external drive signal $V_{GS}$ changes before the first transistor device 2 switches. This is illustrated in FIGS. 5A and 5B, wherein FIG. 5A illustrates a transition from the off-state to the on-state, while FIG. 5B illustrates a transition from the on-state to the off-state.

Referring to FIG. 5A, the drive signal $S_{DRV}$ of the first transistor device 2 changes from the off-level to the on-level at time t8, while the external drive signal $V_G$ already changes from the first signal level $V_{G1}$ to the second signal level $V_{G2}$ at an earlier time t7. In this embodiment, the slope of the internal drive signal $V_{GS}$ and, therefore, the slope of the load path voltage V3, is only dependent on the gate resistance $R_{G3}$ (see FIG. 1) and the second signal level $V_{G2}$.

Referring to FIG. 5B, in the transition from the on-state to the off-state, the first drive signal $S_{DRV}$ switches off the first transistor device 2 at time t9 at which the external drive signal $V_G$ has the second signal level $V_{G2}$. In this case, the slope of the internal drive signal $V_{GS}$ and, therefore, the slope of the load path voltage V3, is only dependent on the gate resistance $R_{G3}$ (see FIG. 1) and the second signal level $V_{G2}$. The external drive signal $V_G$ may change from the second signal level $V_{G2}$ to the first signal level $V_{G1}$ at a later time t10 at which the external drive signal $V_{GS}$ has already decreased to the pinch off voltage $V_{PO}$.

In the following, the operation mode explained with reference to FIGS. 4A and 4B in which the signal level of the external drive signal $V_G$ changes when the first transistor device 2 is in an on-state will be referred to as first operation mode. The operation mode explained with reference to FIGS. 5A and 5B in which the signal level of the external drive signal $V_G$ changes when the first transistor device 2 is in the off-state will be referred to as second operation mode. According to one embodiment, the switch circuits operates in one of the first and second operation modes dependent on a load condition of the switch circuit.

The load condition is, e.g., defined by the load current $I_{DS}$ in the on-state of the switch circuit 1, the load voltage V1 in the off-state of the switch circuit 1, or by a combination thereof. In this embodiment, the load condition of the switch circuit is detected and the switch circuit is operated in the first operation mode when an overload condition has been detected, and the switch circuit is operated in the second operation mode when a normal load condition has been detected.

Figure 6:
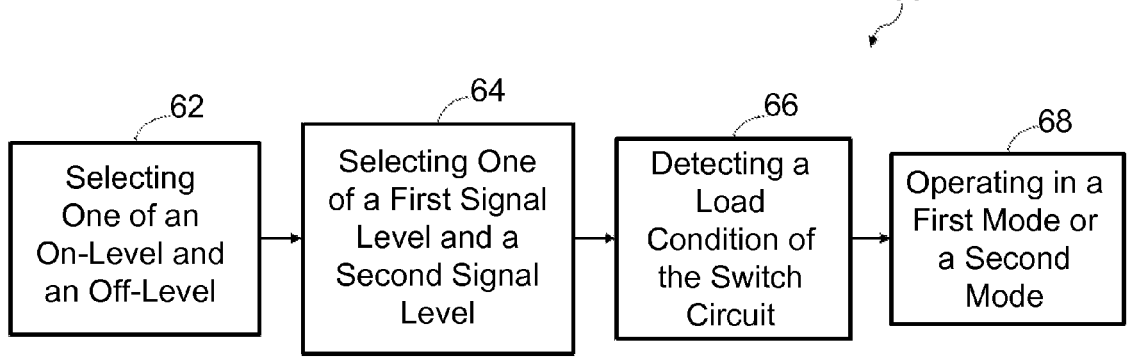
FIG. 6 illustrates a method of operation of a switch circuit according to an embodiment.

FIG. 6 illustrates a method of operation 60 of a switch circuit according to an embodiment. The method of operation includes steps 62, 64, 66, and 68. Step 62 includes selecting one of an on-level and an off-level of a first drive signal received by the control terminal of a first transistor device. Step 64 includes selecting one of a first signal level and a second signal level of a second drive signal received by the control terminal of a second transistor device. In step 66, the load condition of the switch circuit is detected. In step 68, the switch circuit is operated in the first operation mode when an overload condition has been detected, and the switch circuit is operated in the second operation mode when a normal load condition has been detected.

The presence of an overload condition may be detected in different ways. According to a first embodiment, the load current $I_{DS}$ or another parameter representing the load current is measured when the switch circuit 1 is in the on-state, and the presence of an overload condition is detected when the load current $I_{DS}$ is a above a predefined load current threshold. According to a second embodiment, the load voltage V1 across the switch circuit 1 or the load voltage V3 across the second transistor device 3 is measured when the switch circuit 1 is in the off-state, and the presence of an overload condition is detected when the load voltage V1 (or V3) is a above a predefined load voltage threshold.

According to a third embodiment, a time derivative of the load current $I_{DS}$ is measured when the switch circuit 1 switches from the off-state to the on-state, and an overload condition is detected when the time derivative is above a predefined threshold.

According to a fourth embodiment, a time derivative of the load voltage V1 of the switch circuit 1 or V3 of the second transistor device 3 is measured when the switch circuit 1 switches from the on-state to the off-state, and an overload condition is detected when the time derivative is above a predefined threshold.

It goes without saying that more than one of the parameters explained before may be evaluated in order to detect the presence of an overload condition. The drive circuit 4 may be configured to receive at least one of these parameters and to detect the load condition based on this parameter.

In each of the cases explained before the electronic circuit switches from the first operation mode to the second operation mode when a normal load condition is detected, that is when the evaluated parameter is below the corresponding threshold. Further, the individual thresholds may include a hysteresis so as to prevent the electronic circuit from oscillating between the first and second operation mode when the load condition is close to one of the thresholds.

Besides the possibility to control the slope of the load path voltage V3, driving the first and second transistor devices 2, 3 in the way explained before offers an additional benefit.

Assume that a freewheeling element, such as a diode, is connected in parallel with the load path of the first transistor device 2. Such freewheeling element is illustrated in dashed lines in FIG. 1 and may be implemented as an internal diode of the transistor device 2, such as a body diode, or as an external diode. The polarity of this freewheeling element is such that the freewheeling element is reverse biased (blocking) when the transistor device 2 is forward biased. For example, an n-type MOSFET is forward biased when a positive voltage is applied between the drain terminal the source terminal, while a p-type MOSFET is forward biased when a negative voltage is applied between the drain terminal and the source terminal.

In the embodiment of FIG. 1, the first transistor device 2 is implemented as an n-type transistor device with a source terminal as the first load terminal 21 and a drain terminal 22 as the second load terminal. In this embodiment, an anode of the freewheeling diode is connected to the source terminal 21, while a cathode is connected to the drain terminal 22. The freewheeling diode is reverse biased, when a positive voltage V1 is applied to the series circuit with the first transistor device 2 and the second transistor device 3 between a second load terminal 12 and a first load terminal 11. In this embodiment, the second load terminal 32 of the second transistor device 3 is connected to the second load terminal 12, while the first load terminal 21 of the first transistor device 2 is connected to the first load terminal 11.

When the voltage V1 across the series circuit is a positive voltage, the freewheeling diode does not affect the operation of the switch circuit 1. When, however, a negative voltage V1 is applied, the freewheeling diode is forward biased, so that the first transistor device 2 may conduct a current. The voltage drop across the freewheeling diode is, e.g., in the range of about 0.7V when the diode is a silicon diode. The internal drive signal $V_{GS}$ of the second transistor device 3 corresponds to the external drive signal $V_G$ minus the voltage drop across the diode.

According to one embodiment, the external drive signal $V_G$ is significantly higher than the voltage drop across the forward-biased freewheeling diode, so that the second transistor device 3 is in the on-state when the external drive signal $V_G$ either has the first or the second signal level $V_{G1}$, $V_{G2}$. Thus, a current may flow through the second transistor device 3. Consequently, the switch circuit 1 may conduct a current in the reverse direction (a direction opposite to the current flow direction $I_{DS}$ illustrated in FIG. 1), whereas no freewheeling element is required in the second transistor device 3. While the current through the body diode of the first transistor device 2 is a bipolar current, the current through the second transistor device 3 is a unipolar current. Thus, reverse recovery effects do not occur in the second transistor device 3 when the polarity of the load voltage V1 changes to positive voltage values.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A method for driving a switch circuit, comprising:
   driving the switch circuit to an on-state by
      driving a first transistor of the switch circuit to an on-state using a first drive signal, and
      driving a second transistor of the switch circuit using a second drive signal different from the first drive signal,
      wherein a signal level of the second drive signal is selected from a first signal level and a second signal level different from the first signal level,
      wherein each of the first signal level and the second signal level drive the second transistor to an on-state after the first transistor has been switched on; and
   driving the switch circuit to an off-state by
      driving the first transistor to an off-state using the first drive signal, and
      driving the second transistor to an off-state using the second drive signal, wherein the signal level of the second drive signal is selected from the first signal level and the second signal level, and load paths of the first transistor and the second transistor are connected in series.
2. The method of claim 1, wherein:
   driving the switch circuit to the on-state further comprises changing the signal level of the first drive signal from an off-level to an on-level and changing the signal level of the second drive signal from the first signal level to the second signal level after a first delay time; and
   driving the switch circuit to the off-state further comprises changing the signal level of the second drive signal from the second signal level to the first signal level and subsequently changing the signal level of the first drive signal from the on-level to the off-level after a second delay time.

3. The method of claim 2, further comprising driving the switch circuit into the on-state or the off-state dependent on an input signal.

4. The method of claim 1, wherein:
driving the switch circuit to the on-state comprises changing the signal level of the first drive signal from an off-level to an on-level and changing the signal level of the second drive signal from the first signal level to the second signal level before changing the signal level of the first drive signal; and
driving the switch circuit to the off-state comprises changing the signal level of the second drive signal from the second signal level to the first signal level, and subsequently changing the signal level of the first drive signal from the on-level to the off-level before changing the signal level of the first drive signal.

5. The method of claim 1, wherein the first transistor is a normally-off device and wherein the second transistor is a normally-on device.

6. The method of claim 5, wherein the second transistor is a depletion MOSFET, a JFET, or a HEMT.

7. The method of claim 6, wherein the second transistor comprises silicon, silicon carbide, or gallium nitride.

8. The method of claim 1, further comprising:
detecting a load condition of the switch circuit; and
operating the switch circuit in a first operation mode or a second operation mode dependent on the load condition.

9. The method of claim 8, wherein:
in the first operation mode, driving the switch circuit to the on-state by changing the signal level of the first drive signal from an off-level to an on-level and by changing the signal level of the second drive signal from the first signal level to the second signal level after a first delay time; and
in the first operation mode, driving the switch circuit to the off-state comprises changing the signal level of the second drive signal from the second signal level to the first signal level and subsequently changing the signal level of the first drive signal from the on-level to the off-level after a second delay time.

10. The method of claim 8, wherein:
in the second operation mode, driving the switch circuit to the on-state comprises changing the signal level of the first drive signal from an off-level to an on-level and changing the signal level of the second drive signal from the first signal level to the second signal level before changing the signal level of the first drive signal; and
in the second operation mode, driving the switch circuit to the off-state comprises changing the signal level of the second drive signal from the second signal level to the first signal level and subsequently changing the signal level of the first drive signal from the on-level to the off-level before changing the signal level of the second drive signal.

11. The method of claim 8, wherein detecting the load condition comprises evaluating at least one of: a load current through the switch circuit, a first load voltage across the switch circuit, a second load voltage across the second transistor, a time derivative of the load current, or a time derivative of one of the first and second load voltages.

12. The method of claim 1, wherein the first transistor of the switch circuit comprises a normally-off transistor, and wherein the second transistor of the switch circuit comprises a normally-on transistor.

13. The method of claim 1, wherein each of the first signal level and the second signal level are different from a pinch-off voltage of the second transistor.

14. The method of claim 13, wherein the first signal level is between the pinch-off voltage of the second transistor and the second signal level.

15. The method of claim 1, wherein driving the second transistor of the switch circuit to the on-state using the second drive signal with the first signal level causes the second transistor to operate in a first conduction state, and wherein driving the second transistor of the switch circuit to the on-state using the second drive signal with the first signal level causes the second transistor to operate in a second conduction state different than the first conduction state.

16. The method of claim 15, wherein the first conduction state causes a lower load current than the second conduction state.

17. The method of claim 15, wherein the first transistor has a higher on-resistance in the first conduction state than in the second conduction state.

18. The method of claim 1, wherein driving the second transistor comprises driving the second transistor using an internal drive signal, wherein a signal level of the internal drive signal equals the signal level of the second drive signal minus a level of a load path voltage of the first transistor.

19. An electronic circuit comprising a switch circuit and a drive circuit coupled to the switch circuit, the switch circuit comprising:
a first transistor device having a load path and a control terminal; and
a second transistor device having a load path and a control terminal, the load paths of the first transistor device and the second transistor device coupled in series;
wherein the drive circuit is configured to:
drive the switch circuit to an on-state by driving the first transistor device to an on-state using a first drive signal, and driving a second transistor device using a second drive signal different from the first drive signal, wherein a signal level of the second drive signal is selected from a first signal level and a second signal level different from the first signal level, and each of the first signal level and the second signal level drive the second transistor device to an on-state after the first transistor device has been switched on; and
drive the switch circuit to an off-state by driving the first transistor device to an off-state using the first drive signal, and driving the second transistor device to an off-state using the second drive signal, wherein the signal level of the second drive signal is selected from the first signal level and the second signal level.

20. The electronic circuit of claim 19, wherein the drive circuit is further configured to at least one of:
drive the electronic circuit to the on-state by changing the signal level of the first drive signal from an off-level to an on-level and by changing the signal level of the second drive signal from the first signal level to the second signal level after a first delay time; and
drive the electronic circuit to the off-state by changing the signal level of the second drive signal from the second signal level to the first signal level and by subsequently changing the signal level of the first drive signal from the on-level to the off-level after a second delay time.

21. The electronic circuit of claim 19, wherein the drive circuit is further configured to at least one of:
  drive the switch circuit to the on-state by changing the signal level of the first drive signal from an off-level to an on-level and by changing the signal level of the second drive signal from the first signal level to the second signal level before changing the signal level of the first drive signal; and
  drive the switch circuit to the off-state by changing the signal level of the second drive signal from the second signal level to the first signal level and by subsequently changing the signal level of the first drive signal from the on-level to the off-level before changing the signal level of the second drive signal.

22. The electronic circuit of claim 19, wherein the first transistor device is a normally-off device and wherein the second transistor device is a normally-on device.

23. The electronic circuit of claim 22, wherein the second transistor device is a depletion MOSFET, a JFET, or a HEMT.

24. The electronic circuit of claim 23, wherein the second transistor device comprises silicon (Si), silicon carbide (SiC), or gallium nitride (GaN).

25. The electronic circuit of claim 19, wherein the drive circuit is further configured to drive the electronic circuit into one of an on-state and an off-state dependent on an input signal.

26. The electronic circuit of claim 19, wherein the drive circuit is further configured
  to detect a load condition of the switch circuit; and
  to operate the switch circuit in a first operation mode or a second operation mode dependent on the load condition.

27. The electronic circuit of claim 26, wherein operating the switch circuit in the first operation mode comprises at least one of:
  driving the switch circuit to the on-state by changing the signal level of the first drive signal from an off-level to an on-level and by changing the signal level of the second drive signal from the first signal level to the second signal level after a first delay time; and
  driving the switch circuit to the off-state by changing the signal level of the second drive signal from the second signal level to the first signal level and by subsequently changing the signal level of the first drive signal from the on-level to the off-level after a second delay time.

28. The electronic circuit of claim 26, wherein operating the switch circuit in the second operation mode comprises at least one of:
  driving the switch circuit to the on-state by changing the signal level of the first drive signal from an off-level to an on-level and by changing the signal level of the second drive signal from the first signal level to the second signal level before changing the signal level of the first drive signal; and
  driving the switch circuit to the off-state by changing the signal level of the second drive signal from the second signal level to the first signal level and by subsequently changing the signal level of the first drive signal from the on-level to the off-level before changing the signal level of the second drive signal.

29. The electronic circuit of claim 26, wherein detecting the load condition comprises evaluating at least one of: a load current through the switch circuit, a first load voltage across the switch circuit, a second load voltage across the second transistor device, a time derivative of the load current, or a time derivative of one of the first and second load voltages.

* * * * *